United States Patent [19]
Roohparvar

[11] Patent Number: 5,723,990
[45] Date of Patent: Mar. 3, 1998

[54] INTEGRATED CIRCUIT HAVING HIGH VOLTAGE DETECTION CIRCUIT

[75] Inventor: Frankie F. Roohparvar, Cupertino, Calif.

[73] Assignee: Micron Quantum Devices, Inc., Santa Clara, Calif.

[21] Appl. No.: 493,162

[22] Filed: Jun. 21, 1995

[51] Int. Cl.[6] .............................. H03K 5/153; H03L 7/00
[52] U.S. Cl. .............................. 327/81; 327/80; 327/142
[58] Field of Search .................................. 327/77, 80, 81, 327/74, 142, 143, 198, 530, 545, 546, 538, 541, 543; 365/201, 226, 228

[56]  References Cited

U.S. PATENT DOCUMENTS

| | | | |
|---|---|---|---|
| 4,309,627 | 1/1982 | Tabata | 327/143 |
| 4,321,489 | 3/1982 | Higuchi et al. | 327/81 |
| 4,437,025 | 3/1984 | Liu et al. | 327/475 |
| 4,658,156 | 4/1987 | Hashimoto | 327/77 |
| 4,922,133 | 5/1990 | Iwahashi et al. | 327/77 |
| 5,083,045 | 1/1992 | Yim et al. | 327/80 |
| 5,097,146 | 3/1992 | Kowalski et al. | 327/77 |
| 5,118,968 | 6/1992 | Douglas et al. | 327/81 |
| 5,144,159 | 9/1992 | Frisch et al. | 327/143 |
| 5,214,316 | 5/1993 | Nagai | 327/143 |
| 5,278,458 | 1/1994 | Holland et al. | 327/77 |
| 5,280,198 | 1/1994 | Almulla | 327/296 |
| 5,317,532 | 5/1994 | Ochii | 327/544 |
| 5,378,936 | 1/1995 | Kokubo et al. | 327/143 |
| 5,469,100 | 11/1995 | Wuidart et al. | 327/263 |

FOREIGN PATENT DOCUMENTS 405122052  5/1993  Japan .................................. 326/81

*Primary Examiner*—Toan Tran
*Attorney, Agent, or Firm*—Limbach & Limbach L.L.P.

[57] ABSTRACT

A high voltage detection circuit implemented in an integrated circuit which is switchable between a normal operation mode and an alternative operation mode and having contact pads for electrically connecting the integrated circuit to an external environment. One of the pads functions to provide an interface between an external environment and the integrated circuit for signals having a maximum voltage magnitude, relative to a circuit common, when the integrated circuit is in the normal operation mode. The one pad further functions to receive an external test mode signal which will cause the integrated circuit to switch to the test mode of operation, with the test mode signal having a voltage magnitude which is greater than that of maximum voltage magnitude. The detection circuit includes a first MOS transistor having either the gate or source coupled to the one pad and a second MOS transistor having a source and drain connected in series with the drain and source of the first transistor. An output circuit is included having an input connected to a first node intermediate the first and second transistors for providing an output when a voltage at the first node exceeds a predetermined trip point.

62 Claims, 3 Drawing Sheets

5,723,990

1

INTEGRATED CIRCUIT HAVING HIGH VOLTAGE DETECTION CIRCUIT

BACKGROUND OF THE INVENTION

1. Field of the Invention

The present invention relates generally to the field of integrated circuits and in particular to integrated circuits having circuitry for detecting external voltages applied to the pads of the circuit typically for the purpose of causing the integrated circuit to enter a non-user mode of operation.

2. Background Art

Integrated circuits have become more complex and the time required to complete the development of the circuits so that they can be introduced to the market has become more critical. As a result, it is desirable to have the capability of making last minute changes in the design, such as the modification of internal parameters, in a timely manner. Until recently, this has been accomplished by making modifications to the integrated circuit masks thereby permitting changes to the metallization or changes to the contacts between the metallization and the silicon. These masks are near completion and the end of the fabrication process and making changes to the chip using such masks can be done fairly quickly. However, this approach still does not provide as much flexibility as is desirable and does permit not permit sufficiently quick turn around in some circumstances.

In many integrated circuits, and in non-volatile memories in particular, greater flexibility is achieved through the use of memory elements for modifying circuit parameters. By programming a specific pattern in the memory elements, one can change the configuration of the circuitry or even the configuration of the entire integrated circuit. The modification of these settings is accomplished through non-user modes of operation, such as test operation modes. Needless to say, accidental modification of any of these settings or parameters would have a devastating effect on the operation of the integrated circuit.

In order to avoid any such accidental modification, the entering or executing of the test modes of operation typically requires the application of voltages to the external pins of the integrated circuit which are greater in magnitude than those used in normal operation. By way of example, in some conventional integrated circuit memory systems which operate from a primary power source Vcc of +5 volts, some pins which, in normal operation, never exceed about +5 volts will have +12 volts applied to them to cause entry into these test operation modes.

The present invention relates to circuitry for detecting the presence of high voltage to the external pins of an integrated circuit. The circuitry must not respond to the lower level voltages applied to the pins in normal operation and must not interfere with the normal operation of the integrated circuit, including the signals that are applied to the pins in normal operation.

The present invention meets the above-noted objectives. These and other advantages of the present invention will be apparent to those skilled in the art upon a reading of the following Detailed Description of the Invention together with the drawings.

SUMMARY OF THE INVENTION

An integrated circuit having a high voltage detection circuit is disclosed which is implemented in an integrated circuit, with the integrated circuit switchable between a normal operation mode and an alternative operation mode.

2

The integrated circuit has a plurality of contact pads for electrically connecting the integrated circuit to an external environment, with one of the pads functioning to provide an interface between an external environment and the integrated circuit for signals having a maximum voltage magnitude, relative to a circuit common, when the integrated circuit is in the normal operation mode.

When in the alternative operation mode, the one pad functions to receive an external mode control signal which will cause the integrated circuit to switch to the alternative operation mode, with the mode control signal having a magnitude which is greater than that of maximum voltage magnitude. The detection circuit includes a first MOS transistor, with one of the gate and source of the first transistor being coupled to the one pad. In the event the first transistor is a P channel device, the source of the transistor is preferably coupled to the one pad. In the event the first transistor is a N channel device, the gate of the transistor is preferably coupled to the one pad.

The detection circuit further includes a second MOS transistor, with the source and drain of the second transistor being connected in series with the drain and source of the first transistor. Output means is also provided having an input connected to a first node intermediate the first and second transistors for providing an output when a voltage at the first node exceeds a predetermined trip point. Preferably, the output means includes a third N channel MOS transistor having its gate coupled to the first node and a threshold voltage equal to the trip point voltage.

DETAILED DESCRIPTION OF THE INVENTION

Figure 1:
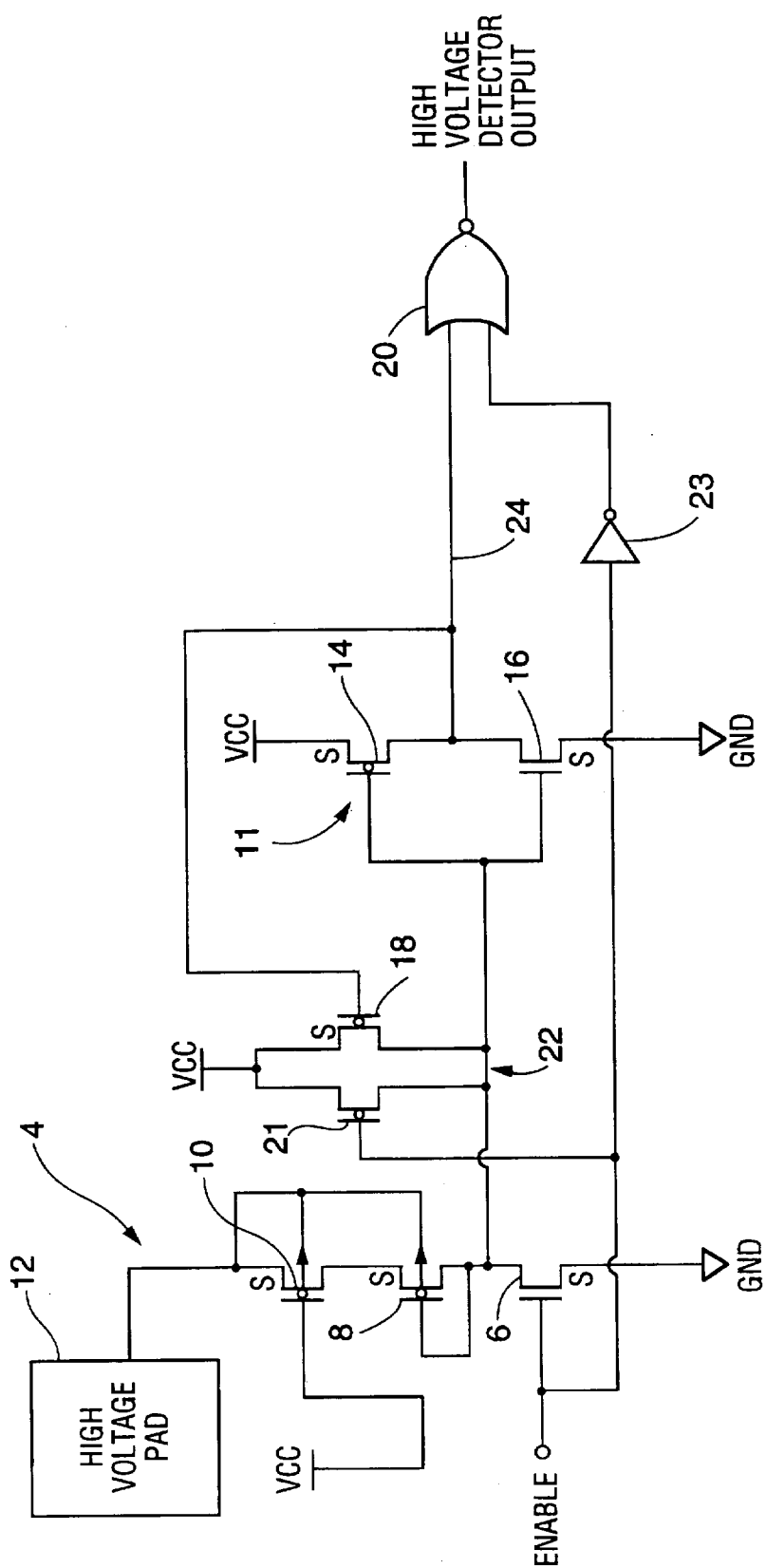
FIG. 1 is a schematic diagram of a first embodiment of the present invention.

Referring to the drawings, FIG. 1 is a schematic diagram of a first embodiment of the present invention. The circuitry, which utilizes CMOS devices, is incorporated into an integrated circuit along with the principal circuitry of the integrated circuit. The input stage 4 of the first embodiment includes three series-connected MOS transistors 6, 8 and 10. The three transistors are connected between the circuit input, pad 12, and the circuit common.

Pad 12 is typically part of the metallization of the integrated circuit as will subsequently be described in connection with FIG. 3. Pad 12 is connected to an external pin of the integrated circuit package by way of a bonding wire or the like. Transistors 8 and 10 are P channel devices, both of which are formed in a common N well (not depicted). The N well, which forms the body of transistors 8 and 10, is connected to pad 12 as is the source of transistor 10.

The gate of transistor 10 is connected to the primary supply voltage Vcc. Voltage Vcc is typically either +3 volts or +5 volts. Transistor 8 is connected as a diode with the gate connected to the drain and to the drain of N channel transistor 6. Transistor 6 has its gate connected to a signal Enable. This signal is high when the integrated circuit is enabled for either user operation or test operation mode.

The common drain connection of transistors 8 and 6, node 22, forms the output of the input stage 4 which is connected to the input of a second stage 11. Second stage 11 includes a CMOS inverter which comprises a P channel transistor 14 and an N channel transistor 16. The output of the second stage 11 on node 24 is connected back to the input by way of a P channel transistor 16. The output is also connected to one input of a two-input NOR gate 20, the output of which forms the detection circuit output.

Another P channel transistor 21 is connected between node 22 and the primary supply voltage Vcc. The gate of transistor 22 is connected to receive signal Enable. In addition, signal Enable is connected to the input of an inverter 23, with the output of the inverter being connected to the second input of NOR gate 20.

In a normal operation mode, the voltages which appear on pad 12 will be the range of voltages which are produced by ordinary TTL or CMOS level signal ranging between ground and the primary supply voltage Vcc (+3 or +5 volts). Typical specifications for the voltages which can be applied to pad 12 without damage range from −1.0 volt to a voltage equal to the sum of the primary supply voltage Vcc and +2 volts. Thus, for a Vcc of +5 volts, the voltage at pad 12 may approach +7 volts in the normal operation mode.

The gate of transistor 10 is connected to voltage Vcc. Thus, the gate-source voltage would typically be 0 volts, but could also be −2.0 volts worst case. Thus, under typical operating conditions, transistor would be off. However, under worst case conditions, transistor 10 may be conductive to some extent. Even when transistor 10 is conductive under these conditions, the detection circuit will not significantly load the signal applied to the pad 12 and thereby interfere with normal operation of the integrated circuit.

When signal Enable is active, transistor 6 will be conductive and transistor 21 will be off. In addition, the output of inverter 23 will be low. Thus, in the normal operation mode, the output of the first stage on node 22 will be at a low level. This is true notwithstanding the fact that transistor 10 may be slightly conductive. The voltage drop across transistor 8 will help ensure that node 22 remains at a relatively low voltage under these conditions. The output of inverter 11 on node 24 will be at a high level and maintain transistor 18 in an off state. Thus, both inputs to NOR gate 20 will be high so that the output of the detection circuit will be at a low level thereby indicating the normal operation mode.

When the integrated circuit is to be placed in the alternative operation mode, a voltage is applied to pad 12 which exceeds the voltages applied to the pad in the normal operation mode. In the present example, the voltage is +12 volts. The gate-source voltage applied to transistor 10 will exceed the threshold voltage of the transistor causing the transistor to conduct or to be more conductive. The drain of transistor 10 is coupled to node 22 by way of transistor 8, with transistor 8 having a gate-source (and drain-source) voltage roughly equal to the threshold voltage of the transistor of typically +0.7 volts.

Thus, transistor 10 will tend to pull up node 22 and conductive transistor 6 will tend to pull the node down. Transistor 10 is sized (W/L) to provide more current than transistor 6 so that, as the pad approaches +12 volts, node 22 will be pulled until it reaches the trip point of inverter 11 which is typically set equal to the primary supply voltage Vcc divided by two. The trip point of inverter 11 can be adjusted to a desired level by the selection of appropriate relative sizes of transistors 14 and 16. Transistor 8, as previously noted, functions to drop a fixed voltage equal to the threshold voltage of the transistor thereby increasing the magnitude of the voltage which must be applied to the pad 12 to pull node 22 up to the trip point of inverter 11.

Once the trip voltage of inverter 11 is reached, the output of the inverter, node 24, will go low. The low voltage on this node will cause the output of NOR gate 20 to go high thereby producing an active high voltage detection circuit output. This active signal will be used by the integrated circuit to switch the integrated circuit to the alternative operation mode.

The low voltage on node 24 is fed back to transistor 18 and will cause the transistor to turn on thereby causing the voltage at the node 22 to be pulled up even higher. This positive feedback provides hysteresis so that the voltage applied to pad 12 necessary to maintain the detection circuit output active is reduced. Thus, once the integrated circuit has entered the alternative operation mode, a slight drop in the voltage applied to pad 12 due to noise and the like will not cause the integrated circuit to exit the alternative operation mode.

The magnitude of the voltage applied to pad 12 necessary for entry into the test mode, the detection circuit trip point, is made less dependent upon process variations since the input stage 4 is implemented with complementary devices (transistors 6 and 10) as is inverter stage 11 (transistors 14 and 16). Thus any variations in the P channel devices will tend to offset one another as will variations in the N channel devices.

When the FIG. 1 circuit is in the alternative operation mode, the circuit draws a significant amount of current. Power consumption is usually not an issue in this mode of operation. In fact, since transistor 10 does draw current in this mode, the likelihood that pad 12 would ever approach the trip point of the FIG. 1 detector because of a charge build up on the pad or similar occurrence is essentially eliminated. However, when the integrated circuit is in a normal operation mode and the integrated circuit is powered down, signal Enable will go low (inactive) thereby preventing the input stage from drawing current. Transistor 21 will become conductive thereby pulling node 22, which would otherwise be at a high impedance, up to a high level approaching voltage Vcc. In addition, one input of NOR gate 20 will be at a high level so that the detection circuit output will be forced to a low level.

Figure 2:
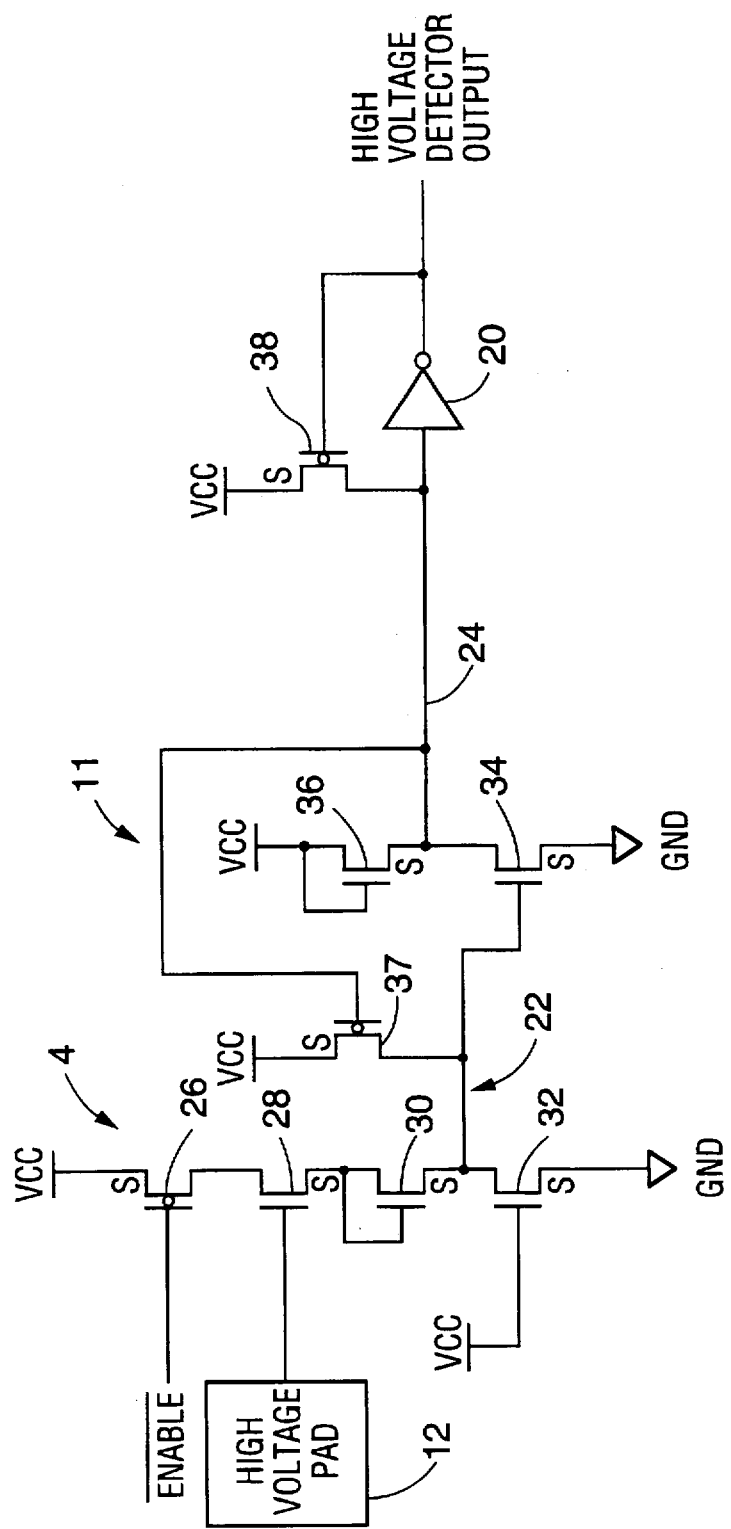
FIG. 2 is a schematic diagram of a second embodiment of the present invention.

FIG. 2 is a schematic diagram of a second embodiment detection circuit. This circuit also includes an input stage 4 connected to a pad 12. The input stage 4 includes four series-connected transistors 26, 28, 30 an 32 connected between the primary supply voltage Vcc and the circuit common. Transistor 26 is a P channel device having its source connected to the supply voltage Vcc and its drain connected to the drain of N channel transistor 28. The gate of transistor 26 is connected to signal $\overline{\text{ENABLE}}$, which is active low. When the circuit is in a low power mode, signal $\overline{\text{ENABLE}}$ is high thereby forcing transistor 26 off so that the input stage 4 is inoperative and not conducting current.

Transistor 28 has its gate connected to pad 12 and its source connected to the drain gate of diode-connected N channel transistor 30. The source of transistor 30 is connected to the output of the input stage at node 22 and to the drain of a third N channel transistor 32. The source of transistor 32 is connected to the circuit common and the gate is connected the primary supply voltage Vcc.

The FIG. 2 circuit includes a second stage 11 which includes two N channel transistors 34 and 36 connected in series between the supply voltage Vcc and the circuit common. The gate of transistor 34 functions as the input to the second stage and the drain functions as the output. Transistor 36 is connected as a diode and functions as a load for transistor 36. The output of the second stage 11 at node 24 is connected back to the gate of a P channel transistor 37, with the source and drain of this transistor being connected between primary voltage Vcc and node 22, respectively.

The output of the second stage 11, node 24, is connected to a third stage which includes inverter 20 and P channel transistor 38. The output of inverter 20, which forms the detection circuit output, is also connected back to the gate of transistor 38, with the source of the transistor 38 being connected to supply voltage Vcc and the drain connected to node 24.

In the normal operation mode, all of the transistors 26, 28, 30, and 32 will be active and conducting at least a small amount of current. Signal ENABLE is active or low so that transistor 26 is on. The voltage applied to pad 12 in the normal operation mode will be no larger than the maximum specified voltage of Vcc plus +2 volts. Transistor 28 is configured to operate as a source follower so that the source voltage will be equal to the pad 12 voltage less some voltage greater than or equal to the threshold voltage of transistor 28. Diode-connected transistor 30 will drop a gate-source voltage approximately equal to the threshold voltage of the device. In addition, transistor 32 will be conductive by virtue of the gate-source voltage being equal to Vcc.

The voltage at node 22, the output of the input stage 4, will tend to be pulled up by transistor 28 and will tend to be pulled down by transistor 32. In the normal mode of operation, transistors 28 and 32 are relatively sized such that the voltage at node 32 will be close to ground level. The voltage at node 22 will be less than the threshold voltage of transistor 34 of the second stage 11 so that transistor 34 will be off and the output at node 24 will be pulled up to a voltage approaching Vcc by load transistor 36. Thus, feed back transistor 37 will be non-conducting.

The high logic state on node 24 will be inverted by inverter 20 so that the detection circuit output will be low thereby indicating the normal operation mode. Since transistor 36 is not capable of pulling node 24 all the way up to voltage Vcc, but only voltage Vcc less the threshold voltage of transistor 36, the input of inverter 20 will not be high enough in all circumstances to completely turn off the internal pull down transistor (not depicted) of the inverter. Thus, inverter 20 will have some tendency to conduct a significant amount of current. However, feedback transistor 28 will be conductive in this state so that the transistor will pull node 24 essentially all the way up to Vcc thereby ensuring that the input to inverter 20 is sufficiently high so as to eliminate current consumption in the inverter.

When the integrated circuit is to be placed in the alternative operation mode, a voltage of +12 volts is applied to pad 12. Transistor 28 is sized relative to transistor 32 so that it is capable of providing a large amount of current compared to transistor 32. Thus, when the gate voltage of transistor 28 is increased to +12 volts, the source of transistor will come closer to the supply voltage Vcc as the current driving capability of the transistor is increased due to the higher gate voltage. The voltage at node 22 will be an additional threshold voltage below the voltage at the source of transistor 28 due to diode-connected transistor 30. However, the voltage at node 22 will be relatively high and greater than the threshold voltage on transistor 34 of the second stage 11.

When transistor 34 turns on, node 24 will be pulled towards ground potential. The low voltage on node 24 will turn on transistor 37 which causes node 22 to be pulled up further towards voltage Vcc. This positive feedback provides a degree of hysteresis so that the voltage applied to pad 12 may be lowered somewhat and the output of the second stage 11 on node 24 will remain low.

The low output of the second stage on node 24 will cause the output of inverter 20 to go high. Thus, the output of the detection circuit will reflect that the integrated circuit is in the alternative operation mode. The pull-up transistors 28 and 36 of the input and second stages are both N channel devices, and since the pull-down transistors 32 and 34 of the two stages are also N channel devices. Accordingly, process variations will tend to cancel one another so as to increase the stability of the trip point voltage of the detection circuit.

Figure 3:
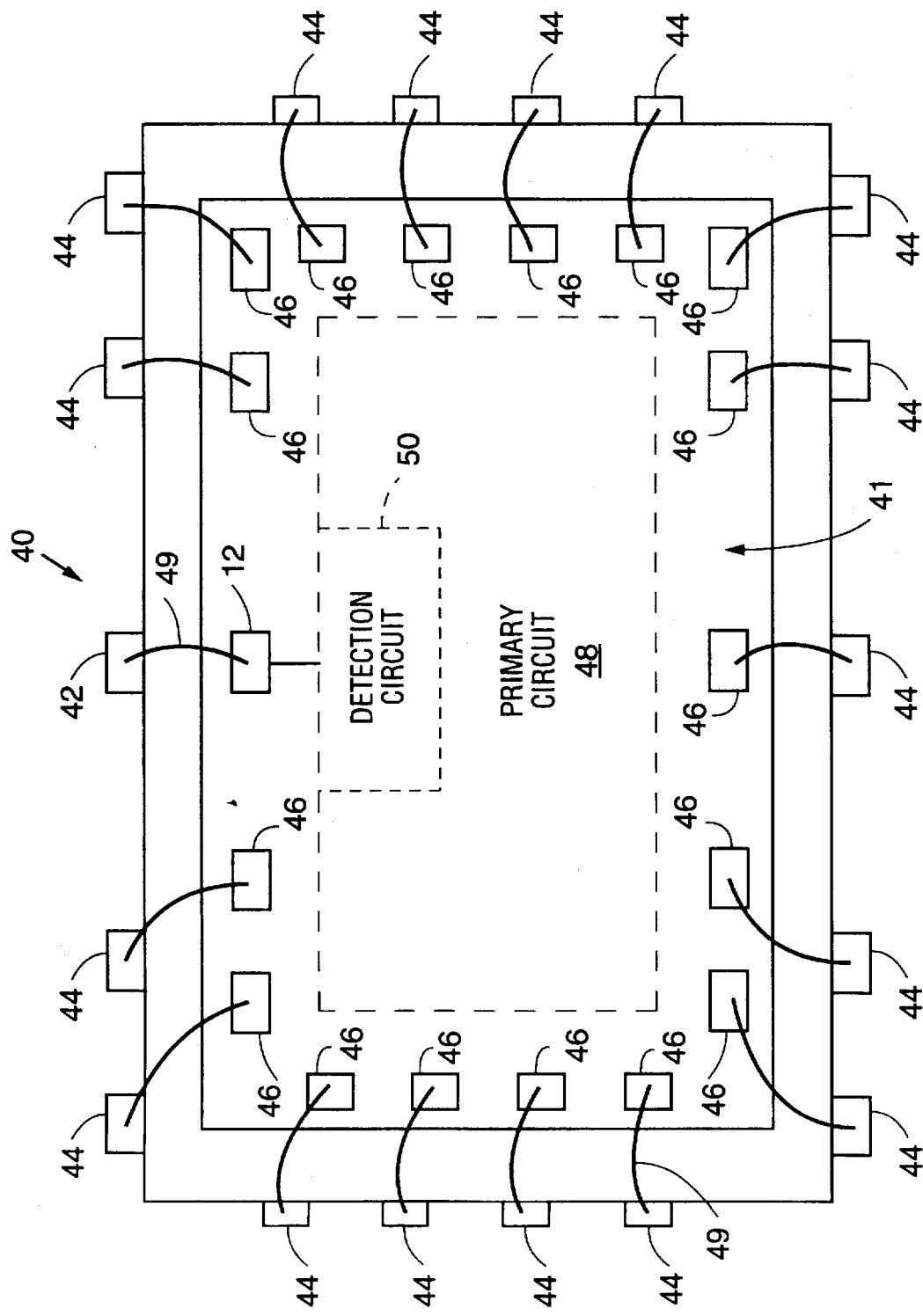
FIG. 3 is a simplified diagram of an integrated circuit incorporating the present invention.

FIG. 3 is a simplified diagram illustrating the interrelationship between the subject detection circuit and the remainder of the integrated circuit and the integrated circuit packaging. The integrated circuit 41 is shown installed in an a circuit package having a plurality of pins 42 and 44 for electrically interfacing the integrated circuit with the external environment. The integrated circuit itself includes the detection circuit 50 and the primary circuit 48. By way of example, if the detection circuit 50 is being used in a memory system, the primary circuit 50 would include all circuitry necessary for a functioning memory system and circuitry for responding to the output of the detection circuit 50 for switching the integrated circuit between a normal operation mode and an alternative operation mode. The circuit 41 may include additional circuitry which responds to the output of the subject high voltage detection circuit and which places the memory in an alternative mode of operation comprising one of a plurality of test modes. Such additional circuitry is disclosed, for example, in a co-pending application entitled APPARATUS FOR ENTERING AND EXECUTING TEST MODE OPERATIONS FOR MEMORY filed on Feb. 10, 1995 and granted Ser. No. 08/386,704.

The integrated circuit 41 includes a plurality of metal pads 46 and 12 which are part of the metallization of the circuit 41. The pads 46 and 12 are electrically connected to the pins 42 and 44 of the package by way of bonding wires 49 or the like. The detection circuit 50 is specifically connected to pad 12, as also depicted in FIGS. 1 and 2.

In the normal mode of operation, signals are applied to the various pins 44 and 42 so that conventional operations associated with the primary circuit 48, such as memory operations, can take place. Pin 42 is chosen so that the voltages which are applied to the pin, by either an external source or a source internal to the integrated circuit 41 have a maximum magnitude which is typically equal to the sum of the primary supply voltage Vcc and +2 volts. Thus, if voltage Vcc was +5 volts, the maximum voltage which should be applied to pin 42 (or pad 12) is +7 volts when the integrated circuit is in the normal operation mode. In this mode of operation, detection circuit 50 must not interfere with the signals applied to pin 42 (or pad 12) and must not respond to such signals by issuing an active detection circuit output.

An end user of the circuit 41 would usually have no reason to cause the integrated circuit 41 to enter the alternative operation mode. Furthermore, the detection circuit 50 is designed to prevent accidental entry into this mode. When a circuit developer desires to place the integrated circuit 50 in the alternative operation mode, a voltage having a magnitude greater than the maximum voltage of +7 volts in the present example, such as +12 volts, is applied to pin 42. As previously described, this will cause the detection circuit 50 to provide an active output signal and thereby cause the integrated circuit 41 to enter the alternative operation mode.

In that mode, many of the functions of the pins 44 in the normal mode of operation are converted to input and output testing functions. A wide variety of testing functions can be provided and the particular testing functions used will not be described since they form no part of the present invention.

Thus, two embodiments of a novel detection circuit have been disclosed. Although these embodiments have been described in some detail, it is to be understood that certain changes can be made by those skilled in the art without departing from the spirit and scope of the invention as defined by the appended claims.

I claim:

1. A mode detection circuit implemented in an integrated circuit, said integrated circuit switchable between a normal operation mode and an alternative operation mode and having a plurality of contact pads for electrically connecting the integrated circuit to an external environment, with one of the pads functioning to provide an interface between an external environment and the integrated circuit for signals having a maximum voltage magnitude, relative to a circuit common, when the integrated circuit is in the normal operation mode and with the one pad functioning to receive an external mode control signal which will cause the integrated circuit to switch to the alternative operation mode, with the mode control signal having a voltage magnitude which is greater than that of the maximum voltage magnitude, said detection circuit comprising:

a first transistor having a gate, a source and a drain, with one of the gate and source coupled to the one pad;

a second transistor having a gate, source and drain, with the source and drain of the second transistor being connected in series with the drain and source of the first transistor;

output circuitry having an input connected to a first node intermediate the first and second transistors said output circuitry being configured to provide an output when a voltage at the first node exceeds a predetermined trip point, with the output circuitry comprising a third transistor having a gate, source and drain and a fourth transistor having a gate, source and drain, with the gate of the third transistor coupled to the first node, the drain of the third transistor coupled to a second node and with the source and drain of the third transistor connected in series with the source and drain of the fourth transistor;

feedback circuitry operatively coupled to the first and second nodes and configured to produce positive feedback from the second node to the first node; and wherein the first transistor and any additional transistors connected between the first node and the one pad, together with the fourth transistor, are of a same channel type and wherein the second transistor and the third transistor are of a same channel type.

2. The detection circuit of claim 1 wherein the first, second, third and fourth transistors are N channel transistors.

3. The detection circuit of claim 2 wherein the gate and drain of the fourth transistor are coupled together.

4. The detection circuit of claim 1 wherein the first and fourth transistors are P channel transistors and the second and third transistors are N channel transistors.

5. The detection circuit of claim 4 wherein the gate of the fourth transistor is coupled to the first node.

6. The detection circuit of claim 1 wherein the feedback circuitry comprises a fifth transistor having a gate, a drain and a source, with the gate coupled to the second node and the drain coupled to the first node.

7. The detection circuit of claim 6 wherein the fifth transistor is a P channel transistor and the source is connected to a primary supply voltage of the integrated circuit.

8. The detection circuit of claim 1 wherein said any additional transistors include a fifth transistor having a gate, a drain and a source, with the fifth transistor being of the same channel type as the first transistor and having the drain and source connected in series with the drains and sources of the first and second transistors and disposed intermediate the first transistor and the first node and with the drain and gate of the fifth transistor connected together.

9. The detection circuit of claim 1 wherein the first and fourth transistors are P channel transistors and the source of the first transistor is coupled to the one pad.

10. The detection circuit of claim 9 wherein the gate of the first transistor is coupled to a primary supply voltage of the integrated circuit.

11. The detection circuit of claim 9 wherein the second and third transistors are N channel transistors, with the drain of the second transistor coupled to the first node.

12. The detection circuit of claim 11 wherein the drains of the third and fourth transistors are coupled together.

13. The detection circuit of claim 12 wherein said any additional transistors include a fifth transistor, the fifth transistor being a P channel transistor having a gate, a drain and a source, with the drain and source of the fifth transistor being connected in series with the first and second transistors and intermediate the first transistor and the first node.

14. The detection circuit of claim 13 wherein the drain and gate of the fifth transistor are coupled together.

15. The detection circuit of claim 14 wherein the feedback circuitry comprises a sixth transistor having a gate, a source and a drain, with the sixth transistor being a P channel transistor having the gate coupled to the second node, the drain coupled to the first node and the source coupled to a primary supply voltage of the integrated circuit.

16. The detection circuit of claim 15 wherein the gate of the second transistor is coupled to an enable signal which is switchable between a first voltage level which exceeds a threshold voltage of the second transistor and a second voltage level which is less than the threshold voltage of the second transistor.

17. A mode detection circuit implemented in an integrated circuit, said integrated circuit switchable between a normal operation mode and an alternative operation mode and having a plurality of contact pads for electrically connecting the integrated circuit to an external environment, with one of the pads functioning to provide an interface between an external environment and the integrated circuit for signals having a maximum voltage magnitude, relative to a circuit common, when the integrated circuit is in the normal operation mode and with the one pad functioning to receive an external mode control signal which will cause the integrated circuit to switch to the alternative operation mode, with the mode control signal having a voltage magnitude which is greater than that of the maximum voltage magnitude, said detection circuit comprising:

a first N channel transistor having a gate, a source and a drain, with the gate coupled to the one pad;

a second transistor having a gate, source and drain, with the source and drain of the second transistor being connected in series with the drain and source of the first transistor;

a third P channel transistor having a gate, a source and a drain, with the drain and source of the third transistor being connected in series with the first and, second transistors and the source being connected to a primary supply voltage; and output circuitry having an input connected to a first node intermediate the first and second transistors, said output circuitry configured to provide an output when a voltage at the first node exceeds a predetermined trip point.

18. The detection circuit of claim 17 wherein the output circuitry comprises a fourth and a fifth transistor, with the fourth transistor being an N channel transistor having a gate, a source and a drain, with the gate of the fourth transistor being coupled to the first node and with the fifth transistor having a gate, a source and a drain, the drain and source of the fifth transistor being connected in series with the drain and source of the fourth transistor and with the source of the fifth transistor being coupled to a second node together with the drain of the fourth transistor.

19. The detection circuit of claim 1 wherein the feedback circuitry comprises a fifth transistor, the fifth transistor being a P channel transistor having a gate, a source and a drain, with the gate of the fifth transistor coupled to the second node and the drain coupled to the first node.

20. A mode detection circuit for detecting when a mode control signal reaches a predetermined voltage level, said detection circuit comprising:

a first N channel transistor having a gate, a source and a drain, with the gate coupled to receive the mode control signal;

a second transistor having a gate, source and drain, with the source and drain of the second transistor being connected in series with the drain and source of the first transistor;

output circuitry having an input connected to a first node intermediate the first and second transistors said output circuitry configured to produce an output when a voltage at the first node exceeds a predetermined trip point, with the output circuitry comprising a third transistor having a gate, source and drain and a fourth transistor having a gate, source and drain, with the gate of the third transistor coupled to the first node and with the source and drain of the third transistor connected in series with the source and drain of the fourth transistor; and a fifth transistor having a gate, a drain and a source, with the fifth transistor having the source and drain connected in series with the drains and sources of the first and second transistors and disposed intermediate the first transistor and the first node and with the drain and gate of the fifth transistor connected together.

21. The mode detection circuit of claim 20 wherein the fourth transistor is an N channel transistor.

22. The mode detection circuit of claim 21 wherein the second and third transistors are N channel transistors.

23. The mode detection circuit of claim 22 wherein the fourth transistor has a gate, a drain and a source and wherein the gate and drain of the fourth transistor are coupled together.

24. The mode detection circuit of claim 22 further including feedback circuitry configured to positive feedback to the first node in response to a voltage at the output.

25. The mode detection circuit of claim 24 wherein the feedback circuitry comprises a sixth P channel transistor having a gate, a source and a drain, with the gate of the sixth transistor being coupled to the drain of the third transistor and with the drain of the sixth transistor being coupled to the first node.

26. A detection circuit for detecting when a mode control signal reaches a predetermined voltage level, said detection circuit comprising:

a first transistor having a gate, a source and a drain, with the gate, exclusive of the source and drain, being coupled to receive the mode control signal;

a second transistor having a gate, source and drain, with the source and drain of the second transistor being connected in series with the drain and source of the first transistor;

a third transistor having a gate, a source and a drain, with the source and drain of the third transistor being connected in series with the drain and source of the first and second transistors, with a first node being defined intermediate the second and third transistors and with the third transistor being disposed intermediate the first node and the first transistor; and output circuitry having an input connected to the first node, said output circuitry being configured to produce an output when a voltage at the first node exceeds a predetermined trip point.

27. The detection circuit of claim 26 wherein the first transistor is an N channel transistor.

28. The detection circuit of claim 27 wherein the output circuitry comprises a fourth transistor having a gate, source and drain and a fifth transistor having a gate, source and drain, with the gate of the fourth transistor coupled to the first node and with the source and drain of the fifth transistor connected in series with the source and drain of the fourth transistor.

29. The detection circuit of claim 28 wherein the drain and gate of the third transistor are connected together.

30. The detection circuit of claim 29 wherein second, third and fourth transistors are N channel transistors.

31. The detection circuit of claim 30 further comprising feedback circuitry configured to provide positive feedback to the first node in response to a voltage at the output.

32. The mode detection circuit of claim 31 wherein the feedback circuitry comprises a sixth transistor being a P channel transistor having a gate, a source and a drain, with the gate of the sixth transistor being coupled to the drain of the third transistor and with the drain of the sixth transistor being coupled to the first node.

33. The mode detection circuit of 30 further comprising a sixth P channel transistor having a gate, a drain and a source, with the drain being connected to the drain of the first transistor, the source being connected to a primary supply voltage and the gate coupled to receive an enable signal which functions to switch the detection circuit to an enabled mode when the enable signal causes the sixth transistor to become conductive and to switch the detection circuit to a disabled mode when the enable signal causes the sixth transistor to become non-conductive.

34. A mode detection circuit for detecting when a mode control signal reaches a predetermined voltage level, said detection circuit comprising:

a first P channel transistor having a gate, a source and a drain, with the source connected to receive the mode control signal;

a first N channel transistor having a gate, a source and a drain, with the source and drain connected in series with the source and drain of the first P channel transistor, and wherein the gate of the first P channel transistor and the gate of the first N channel transistor are connected in a manner such that the gates are independently controlled;

a second P channel transistor having a gate, a drain and a source, with the gate of the second P channel transistor being coupled to a first node intermediate the first P channel and first N channel transistors and with the drain of the second P channel transistor being coupled to a second node; and a second N channel transistor having a gate, a drain and a source, with the gate of the second N channel transistor coupled to the first node and the drain coupled to the second node, with the second node coupled to an output of the detection circuit.

35. The mode detection circuit of claim 34 further comprising positive feedback circuitry, operably coupled to the first and second node, said positive feedback circuitry configured to provide positive feedback from the second node to the first node.

36. The mode detection circuit of claim 34 further comprising a third P channel transistor having a gate, a source and a drain, with the third P channel transistor being disposed intermediate the first P channel transistor and the first node and having the source and drain connected in series with the drain and source of the first P channel transistor.

37. The mode detection circuit of claim 36 wherein the drain and gate of the third P channel transistor are coupled together.

38. The mode detection circuit of claim 34 wherein the gate of the first P channel transistor is coupled to a primary supply voltage of the mode detection circuit.

39. The mode detection circuit of claim 34 wherein the gate of the first N channel transistor is coupled to receive an enable signal, with the enable signal switchable between a high voltage level so that the first N channel transistor is turned off thereby disabling the mode detection circuit and a low voltage state so that the first N channel transistor is turned off thereby enabling the mode detection circuit.

40. A mode detection circuit which changes state when a mode control signal reaches a predetermined voltage level, said detection circuit comprising:
  first, second and third transistors, each having a gate, a source and a drain, with the first, second and third transistors having their respective drain and source connected in series, with one of the source and gate of the first transistor coupled to receive the mode control signal; and
  fourth and fifth transistor, each having a gate, a source and a drain, with the fourth and fifth transistors having their respective drains and sources connected in series, with the gate of fifth transistor coupled to a first node intermediate the second and third transistors, and with the drain of the fifth transistor being coupled to a second node, with the second node being coupled to an output of the mode detection circuit, and wherein the first, second and fourth transistors are of a same channel type and wherein the third and fifth transistors are of a same channel type.

41. The detection circuit of claim 40 wherein the mode control circuit is implemented in an integrated circuit having contact pads for providing an interface between signals in the integrated circuit and signals external to the integrated circuit, with the mode control signal to be applied to one of the pads.

42. The detection circuit of claim 41 wherein the integrated circuit has a primary supply voltage to be applied to one of the pads and wherein the predetermined voltage level has a magnitude relative to a circuit common greater than a magnitude of the primary supply voltage relative to the circuit common.

43. The detection circuit of claim 40 wherein the gates of the first, second and third transistors are connected such that voltages applied to the gates are independently controlled.

44. The detection circuit of claim 40 wherein the source of the first transistor is coupled to receive the mode control signal and wherein the first, second and fourth transistors are P channel transistors and wherein the third and fifth transistors are N channel transistors.

45. The detection circuit of claim 44 wherein the gate of the fourth transistor is coupled to the first node and the drain of the fourth transistor is coupled to the second node.

46. The detection circuit of claim 40 wherein the gate of the first transistor is coupled to receive the mode control signal and wherein the first, second third fourth and fifth transistors are N channel transistors.

47. The detection circuit of claim 46 wherein the gate and drain of the fourth transistor are coupled together and the source of the fourth transistor is coupled to the second node.

48. A mode detection circuit for detecting when a mode control signal reaches a predetermined threshold voltage, said detection circuit comprising:
  first, second and third transistors, each having a gate, a drain and a source, with the drains and sources of the first, second and third transistors connected in series so as to define a first node intermediate the first and second transistors and a second node intermediate the second and third transistors, with the first and second transistors being of the same channel type;
  connection circuitry configured to apply a first voltage indicative of a magnitude of the mode control signal to either the source or the gate of the first transistor; and
  voltage sensing circuitry, operably coupled to the second node, said voltage sensing circuitry configured to sense a second voltage at the second node and to provide a dense output of a first state when the mode control signal has a magnitude less than the predetermined voltage level and a sense output of a second state when the first voltage indicates that the mode control signal has increased in magnitude equal to the predetermined threshold voltage.

49. The mode control circuitry of claim 48 wherein the connection circuitry is configured to apply the mode control signal to the source of the first transistor.

50. The mode control circuitry of claim 49 wherein the first and second transistors are P channel transistors and the third transistor is an N channel transistor.

51. The mode control circuitry of claim 50 wherein the voltage sensing circuitry comprises fourth and fifth transistors, with the fourth transistor being a P channel transistor having a gate coupled to the second node and with the fifth transistor being an N channel transistor having a gate coupled to the second node.

52. The mode control circuitry of claim 48 wherein the connection circuitry is configured to apply the mode control signal to the gate of the first transistor.

53. The mode control circuitry of claim 52 wherein the first, second and third transistors are N channel transistors.

54. The mode control circuitry of claim 53 wherein the voltage sensing circuitry comprises fourth and fifth N channel transistors connected in series, with the fifth transistor having a gate coupled to the second node.

55. A method of detecting when a mode control signal applied to a contact pad of an integrated circuit reaches a predetermined voltage level comprising the following steps:
  connecting first, second and third transistors formed in the integrated circuit in series with one another, with the transistors each having a gate, a drain and a source, with a first node being formed intermediate the first and second transistors and a second node being formed intermediate the second and third transistors, with the first and second transistors being of the same channel type;

coupling a first voltage indicative of the magnitude of the mode control signal to either the gate or the source of the first transistor;

developing a second voltage at the second node, with the second voltage having a magnitude indicative of the magnitude of the mode control signal; and sensing the second voltage magnitude and providing an output signal having a first state when the second voltage indicates that the mode control signal magnitude is less than the predetermined voltage level and having a second state when the second voltage indicates that the control signal magnitude has increased to the predetermined voltage level.

56. The method of claim 55 further comprising the step of independently controlling voltages applied to the gates of the first, second and third transistors.

57. The method of claim 55 further comprising the step of switching current flow through the first, second and third transistors off in response to an enable signal and independent of the mode control signal.

58. The method of claim 55 wherein the step of sensing the second voltage magnitude comprises the step of changing the state of the output signal from the second state back to the first state when the mode control signal magnitude drops below a second predetermined voltage level, with the second predetermined voltage level being lower in magnitude than the predetermined voltage level that caused the change from the first stake to the second state.

59. The method of claim 55 wherein the step of applying the first voltage comprises the step of applying the mode control signal to the source of the first transistor.

60. The method of claim 59 wherein the step of sensing the second voltage comprises the step of coupling gates of fourth and fifth transistors to the second node and wherein the first, second and fourth transistors are P channel transistors and the third, and fifth transistors are N channel transistors.

61. The method of claim 55 wherein the step of applying the first voltage comprises the step of applying the mode control signal to the gate of the first transistor.

62. The method of claim 61 wherein the step of sensing the second voltage comprises the step of connecting fourth and fifth transistors in series and coupling a gate of the fifth transistor to the second node and wherein the first, second, third, fourth and fifth transistors are N channel transistors.

* * * * *